United States Patent [19]

Lotfi et al.

[11] Patent Number: 5,642,276
[45] Date of Patent: Jun. 24, 1997

[54] HIGH FREQUENCY SURFACE MOUNT TRANSFORMER-DIODE POWER MODULE

[75] Inventors: Ashraf Wagih Lotfi, Rowlett; Lennart Daniel Pitzele, Rockwall, both of Tex.; John David Weld, Succasunna, N.J.

[73] Assignee: Lucent Technologies Inc., Murray Hill, N.J.

[21] Appl. No.: 385,495

[22] Filed: Feb. 8, 1995

[51] Int. Cl.[6] ................................................. H02M 1/00
[52] U.S. Cl. ........................ 363/144; 363/147; 361/813
[58] Field of Search ................................ 363/144, 126, 363/53, 141, 147; 361/813

[56] References Cited

U.S. PATENT DOCUMENTS

| | | | |
|---|---|---|---|
| 3,958,075 | 5/1976 | Kaufman | 174/16 |
| 4,498,120 | 2/1985 | Kaufman | 361/386 |
| 4,635,179 | 1/1987 | Carsten | 363/70 |
| 4,864,486 | 9/1989 | Spreen | 363/126 |
| 4,914,561 | 4/1990 | Rice et al. | 363/126 |

*Primary Examiner*—Peter S. Wong
*Assistant Examiner*—Shawn Riley
*Attorney, Agent, or Firm*—Alfred G. Steinmetz

[57] ABSTRACT

An integral transformer/rectifier component includes a lead frame having terminals for connecting to conductors of a circuit substrate. A transformer primary and secondary winding is mounted on the lead frame and a rectifying diode is mounted on the same frame and is directly connected to a winding terminal end of the secondary winding, The transformer windings and diode are encapsulated in a thermoset plastic. A terminal end of the diode is extended beyond the encapsulation and used as an output terminal of the integral transformer/rectifier component.

15 Claims, 9 Drawing Sheets

MULTILAYER FLEX WINDINGS

LOCK

HIGH FREQUENCY SURFACE MOUNT TRANSFORMER-DIODE POWER MODULE

FIELD OF THE INVENTION

This invention relates to power converter efficiency and to dissipation in components used in power converters and in particular to a modular transformer-diode (i.e., transode) suitable for surface mounting.

BACKGROUND OF THE INVENTION

A power converter is a circuit having the dual functional task of changing a voltage level and providing a DC output voltage. This function entails the use of both a transformer to alter the voltage level from some input value and a rectifier to provide a DC output voltage. In instances of a step down converter where the level of the output voltage is reduced below the input voltage level, the output current exceeds the input current and hence the conductive losses on the secondary side of the transformer tend to dominate the overall dissipative loss of the entire converter. In fact the major portion of these conduction losses occur in the conductive path connecting the secondary winding of the transformer to the diodes of the rectifier. The fact that this connection carries a high AC current results in higher losses than that of a comparable DC current path. In addition to these dissipative losses the AC current path has stray inductance losses which further detracts from the desired performance of the converter.

Other factors in the performance of a converter are its density or space/footprint requirements on a circuit board and its thermal dissipation characteristics. The separateness of the transformer and rectifier require two distinct footprints and this requirement is spatially inefficient.

SUMMARY OF THE INVENTION

A surface mountable transformer-diode (i.e., transode) embodying the principles of the invention, includes a lead frame having terminals for connecting to conductors of a circuit substrate and a heatsink for facilitating heat transfer. Multilayer planar transformer primary and secondary windings are mounted on the lead frame and a rectifying diode chip is mounted on the same frame and is directly connected to a winding terminal end of the secondary winding and the heat sink. The transformer windings and diode are encapsulated within a thermoset plastic. A terminal end of the diode is extended beyond the encapsulation and used as an output terminal of the transode (i.e.,integral transformer/rectifier) as well as the heatsink.

In a particular embodiment a surface-mountable transode, includes a lead frame having terminals for connecting to conductors on a surface-mount-technology (SMT) substrate. A heatsink is included to facilitate heat removal.

DETAILED DESCRIPTION

Figure 1:
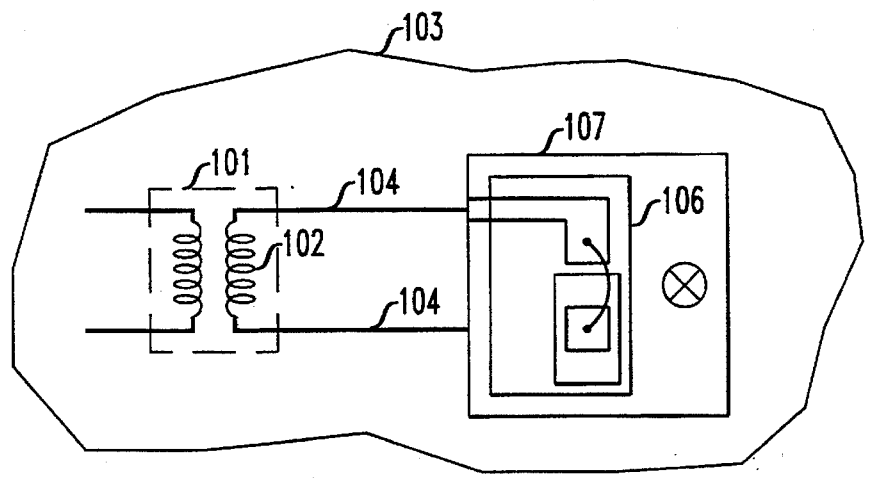
FIG. 1 is a schematic of the typical prior art interconnection of a converter power transformer and the output rectifier.

A typical prior art arrangement of mounting a transformer and rectifier diode on a circuit substrate is shown in the FIG. 1. The transformer 101 shown symbolically comprises a lead frame (not shown) which provides for electrical connections between the secondary winding 102 and conductors 104 deposited on the substrate or printed wiring board (PWB) 103 (shown as a fragment of the PWB). The rectifier diode 106 is mounted on its own separate lead frame 107 which is in turn mounted on the PWB 103. The conductor traces 104, connecting the winding 102 to the rectifier diodes 106, add a resistance to the circuit which is proportional to their length and which is controlled by the physical sizes of the two packages representing the transformer and diode. The dissipation due to this resistance is aggravated by the AC signal output of the secondary winding 102. These conductor traces 104, in addition, take a geometrical form of traces that limit the cross section area available for current conduction and further increase the resistance. Magnetic coupling and line inductance of the traces further increase the peak ringing across the two diodes.

Figure 2:
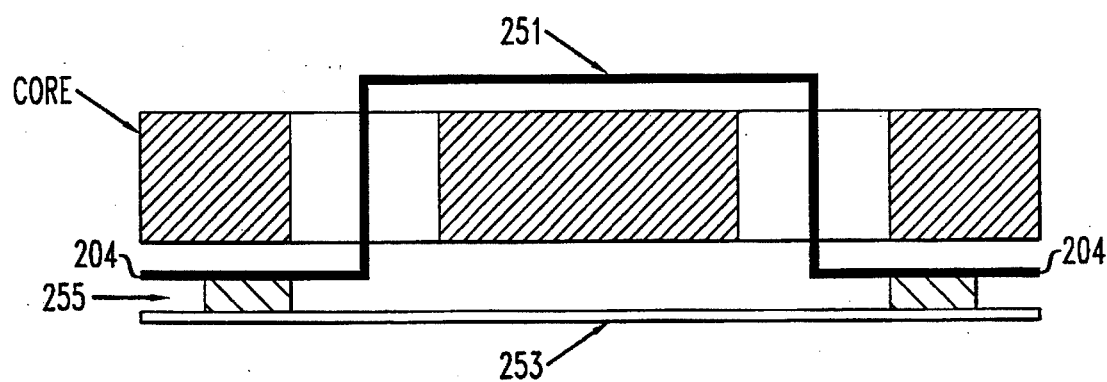
FIG. 2 is a cross section schematic of a prior art transformer rectifier that does not provide surface mount features, heatsinks and protective encapsulation.

A prior art construction of a transformer rectifier as shown in FIG. 2 and disclosed in U.S. Pat. No. 4,635,179 is designed to minimize parasitic and lead inductances by mounting the transformer windings 251 to the substrate 253 and its conductors through rectifier pellets 255 (i.e.,dies). This mounting arrangement and construction does not allow tightly controlled coplanar terminals needed in the SMT processes to produce high density circuits. Furthermore no provision is made for heat removal from the rectifiers. In addition, high reliability dictates the use of a suitable encapsulation method.

Figure 3:
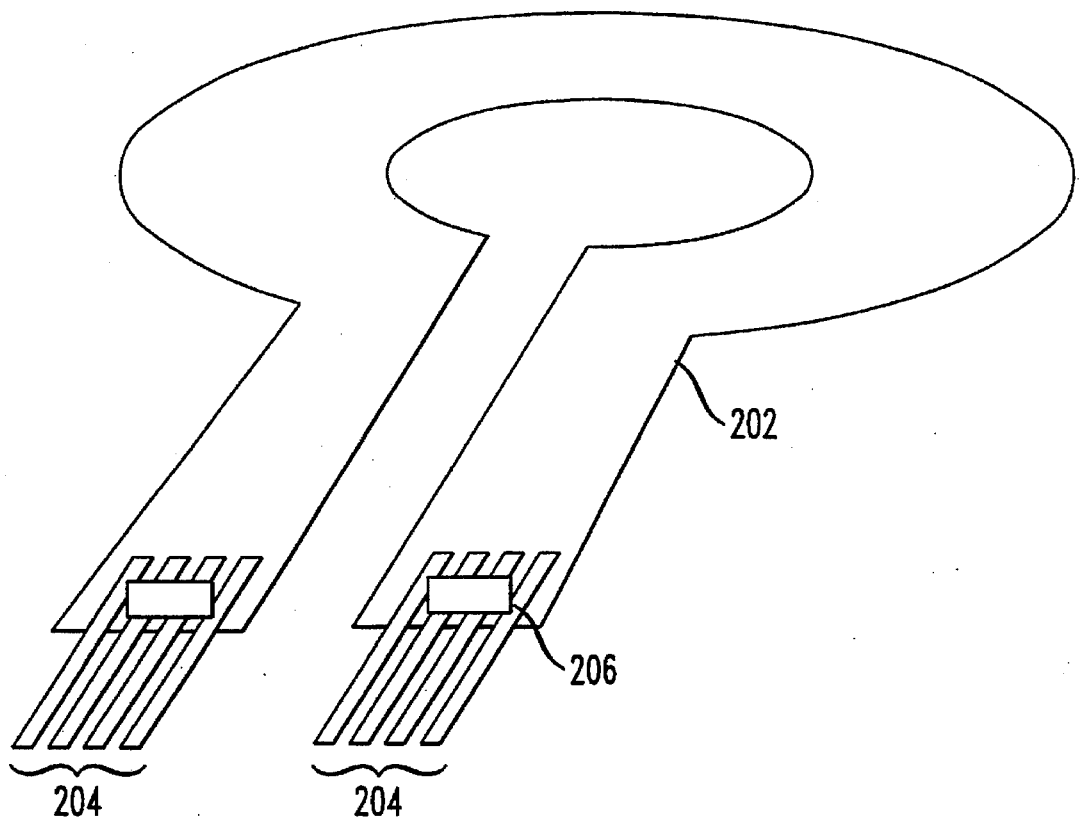
FIG. 3 is a symbolic schematic of the integral transformer/rectifier component.

A combined transformer/rectifier diode package (i.e., transode) designed for surface mounting and a lead frame for heat removal reduces and alleviates many of these inductance problems by eliminating the traces. Such a combined component, such as illustrated in FIG. 3, advantageously minimizes the conduction line length between transformer and rectifier and results in a significant reduction in energy dissipation. The lead frame produces a well defined reference plane used to create surface mountable pins. The leads are constructed coplanar with each other to meet SMT requirements. The heatsink is integral to the transode package and is designed to remove heat form the bare diode dies mounted on the lead frame. The thermoset plastic encapsulation provides environmental protection for the bare diode dies.

A symbolic illustration of the constituent components of such a component package has a multilayer secondary transformer winding 202 (shown illustratively in FIG. 3 as a planar winding) connected to the output leads 204 of lead frame terminations connected to the secondary winding. Also directly connected to the output leads of the lead frames are diode dies 206 forming the rectifier portion of the package.

Figure 4:
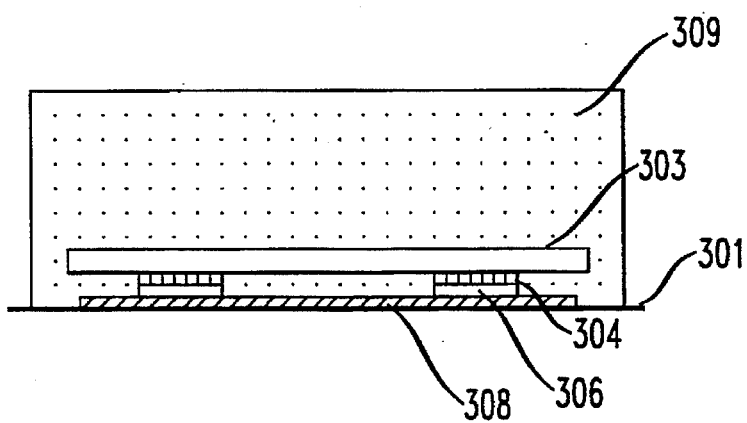
FIG. 4 is a cross section schematic of such a component.

A cross section of such a component is shown in the FIG. 4 as mounted on a PWB/heatsink support 301. A multi layer winding 303 is shown mounted on the leads 304 of a lead frame and Schottky dies 306 containing the diodes interconnect the leads to a copper strip 308 which serves to provide a heat path for the dissipation of heat from the package to the heatsink base. This copper strip also serves to connect the diode die to the completed package both electrically and thermally. The entire package is encapsulated with a thermoset molding compound 309.

Prior to the encapsulation process, a heating cycle in a suitable inert and/or reducing atmosphere is performed for the purpose of preparation of the die for encapsulation. Attachment of the die to the lead frame requires the use of suitable solder that prevent dissolution of bare die metalization. These solders must be formulated with liquidus temperatures that are a suitable margin over other solder liquidus temperatures and profiles used through the SMT manufacturing process.

Figure 5:
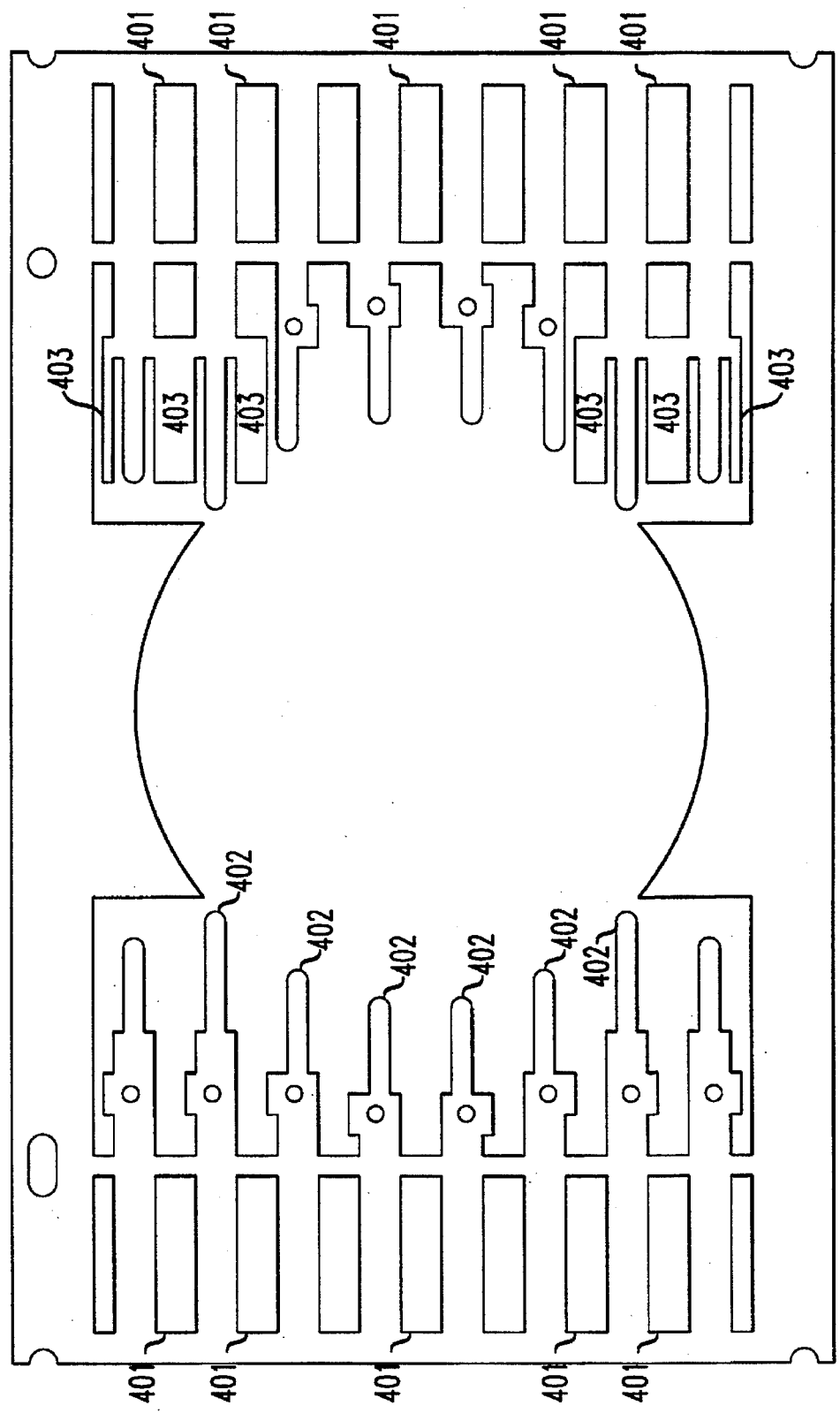
FIG. 5 is a plan view of the lead frame member of the integral transformer/rectifier component.
Figure 6:
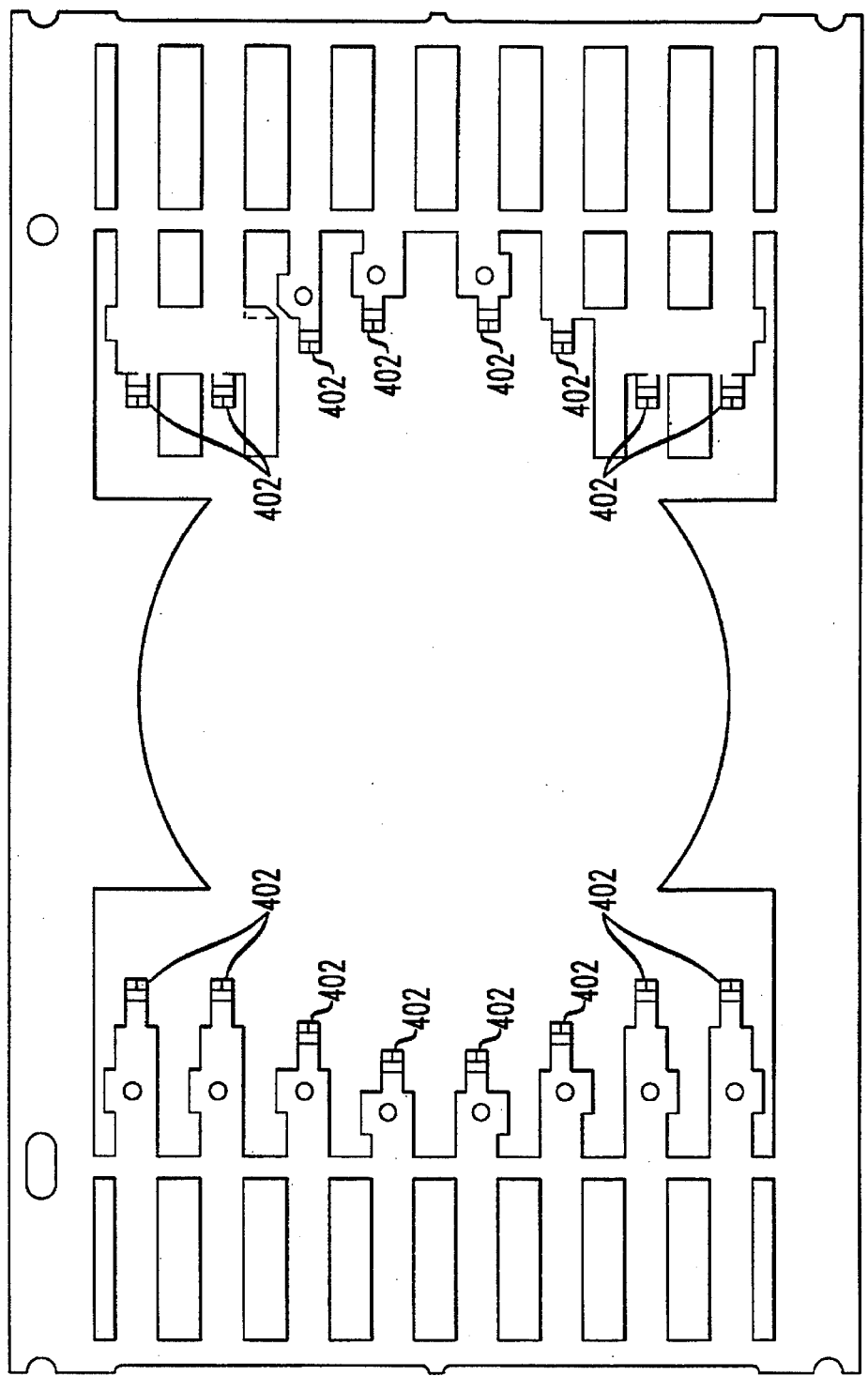
FIG. 6 is a plan view of the lead frame of FIG. 5 with the mounting pins bent into position.

A suitable lead frame, constructed of a conductive material, for use in constructing the transformer/rectifier component is shown in a planar profile in the FIG. 5. The frame supports a plurality of leads 401, shown before the end support is clipped off, for coupling to leads of the circuit substrate. Interior pins 402 are provided for coupling to windings of the transformer. Pads 403 are provided to which the diode dies may be mounted. The interior pins (16 in number) 402 are bent upward to become mounting pins for connection to the windings (flex board windings) of the transformer as shown in the FIG. 6. These flex windings, having conductive vias connected thereto, are positioned over the perpendicular pins and pressed there on. The pads areas 403 are left for mounting of the diode dies thereon. Pin dimensions and bend radii are selected to accommodate existing flex windings and manufacturing procedures.

Figure 7:
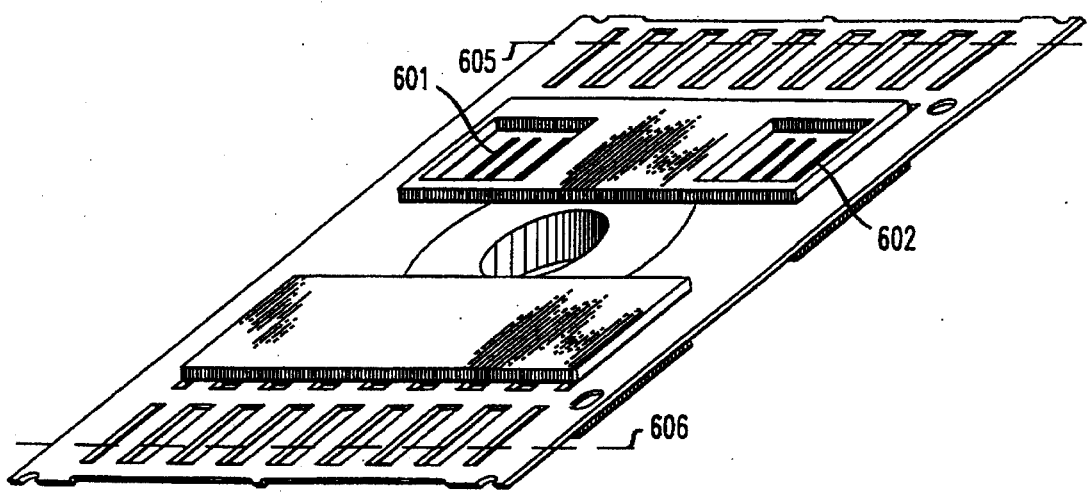
FIG. 7 is a pictorial view of the transformer as attached to the lead frame and with a member having molded cavities for accepting diode dies.

To create a single component the windings of the transformer and the lead frame are encapsulated in a thermoset molding compound to create a structure as shown in the FIG. 7. The mold is designed to leave two cavities 601 and 602 to allow the diode dies to be readily attached to the pad areas. In the illustrative embodiment the wells for accepting the diode dies are created by pedestals designed into the forming mold. This particular arrangement of FIG. 7, at this stage of construction, shows the external leads connected to one another on the lead frame through dam bars and rails. The leads are separated by a trim, along dotted lines 605 and 606, and a form operation resulting in the leads for connection to the substrate.

Figure 8:
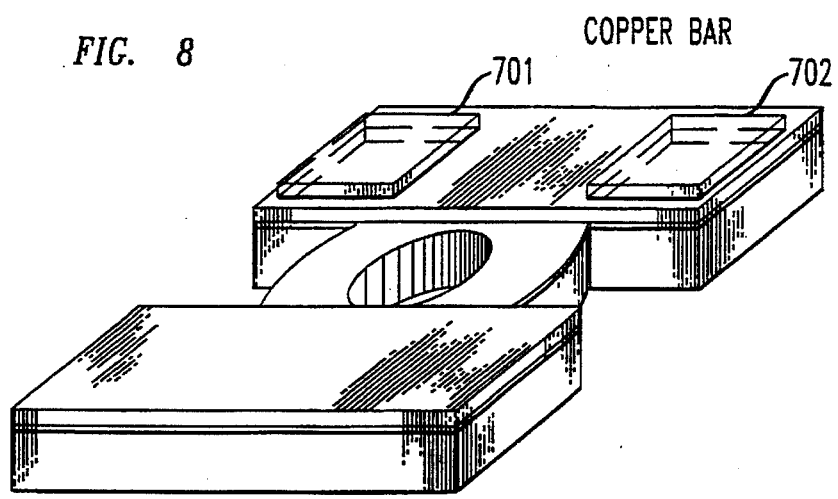
FIG. 8 is a pictorial view of the encapsulated transformer and rectifier structure using the structural arrangement of FIG. 7.

The resulting encapsulated component is schematically shown in the FIG. 8 (without the external leads shown). Copper inserts 701 and 702 are shown inserted into the wells on top of the diode dies. The bare dies (not enclosed in a diode package) are within the wells and the copper inserts 701 and 702 are shown extending out of the well sufficiently to reach the surface of the PWB when the component is mounted on the PWB with the copper inserts on the bottom of the component.

Mounting of the dies and copper inserts is performed in the course of construction after deflashing the pad, by laying solder paste on the pads to mount the die. A second level of solder paste is placed on the die and the copper connectors 701 and 702 are mounted thereon and reflowed creating the single surface mountable component containing the transformer and its rectifier. The solder paste is formulated for minimum interaction with diode metalization.

Figure 9:
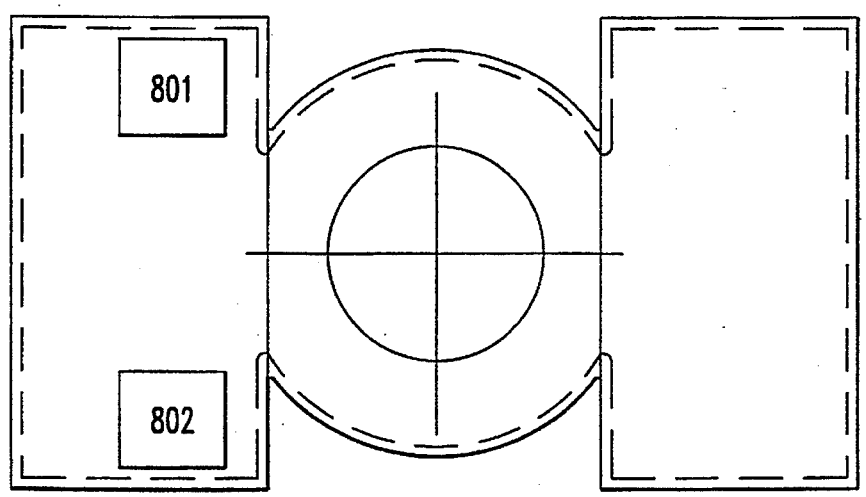
FIGS. 9 and 10 are a plan and elevation view of the structure of FIG. 8.
Figure 10:
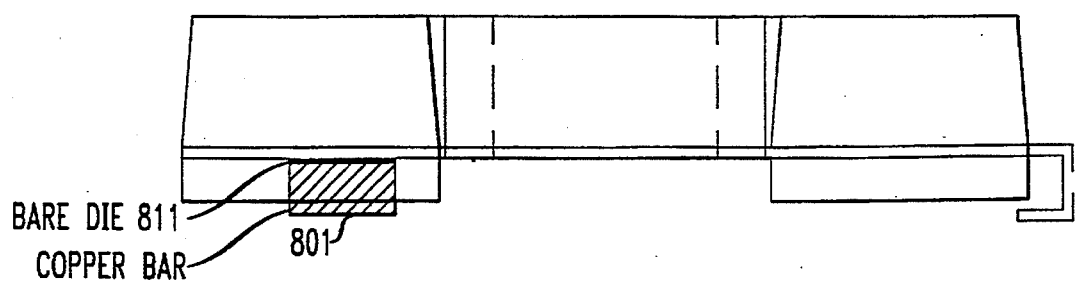

A plan and elevation view of this component is shown in FIGS. 9 and 10. The FIGS. 9 and 10 show the location of the copper inserts 801 and 802 mounted on the dies 811 in a position to provide electrical and thermal connection to the circuit board.

Figure 11:
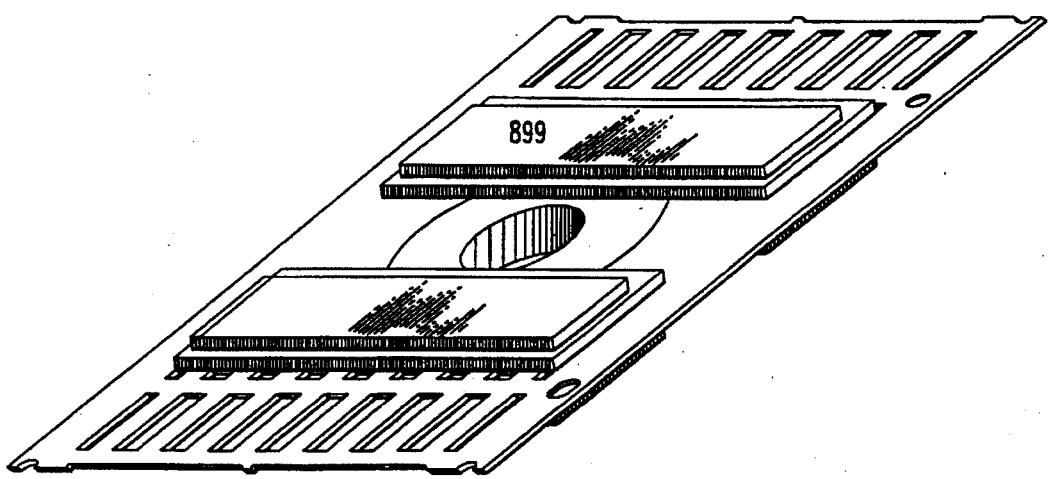
FIG. 11 is a pictorial view of another version of the transformer including cavities for the diode dies attached to the lead frame.
Figure 12:
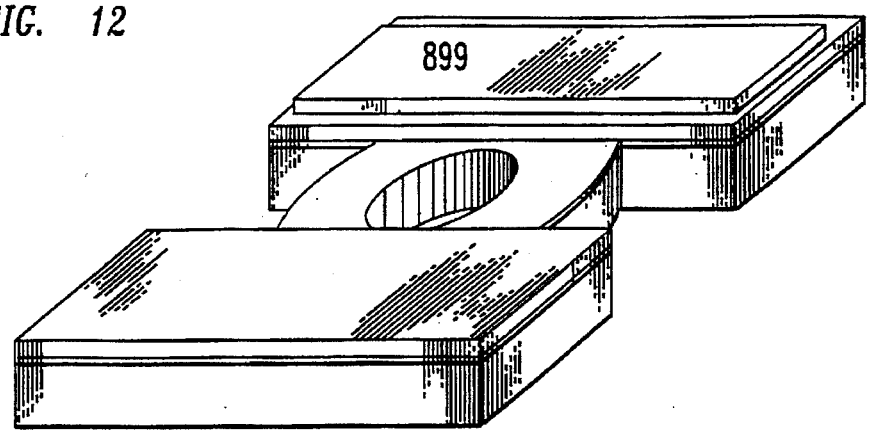
FIG. 12 is a pictorial view of the encapsulated transformer and rectifier structure using the structural arrangement of FIG. 11.
Figure 13:
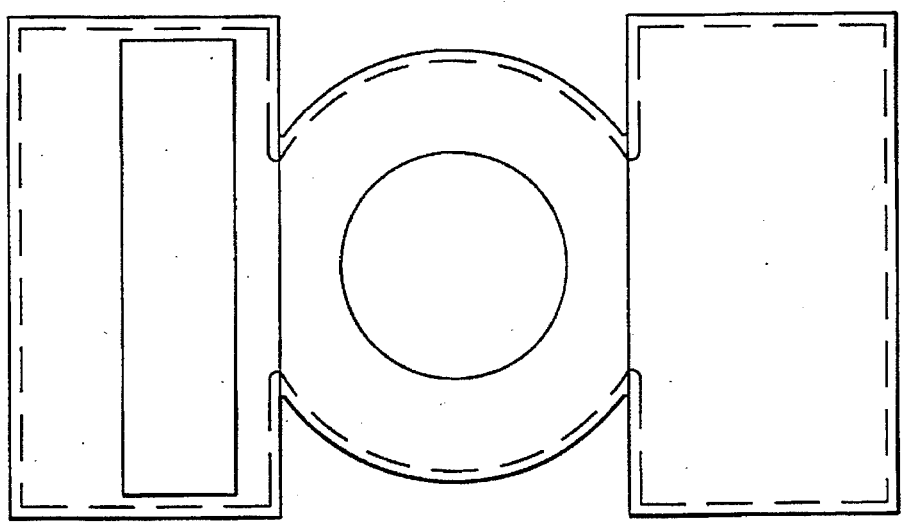
FIGS. 13 and 14 are a plan and elevation view of the structure of FIG. 11.
Figure 14:
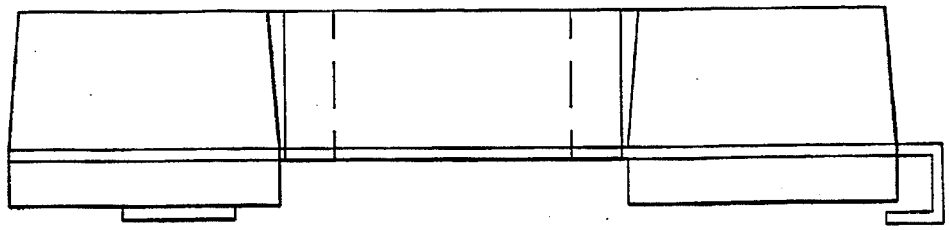

The component structure of FIG. 11 uses a single copper strap 899 exposed to the outside surface and which is positioned in a single mold recess which accepts both rectifier dies. The fully encapsulated structure is (with the connecting leads not shown) as shown in the FIG. 12 discloses the common copper insert 899 as being exposed at the package surface to permit surface mounting on the PWB. This version is shown in the plan and elevation views of FIGS. 13 and 14.

Figure 15:
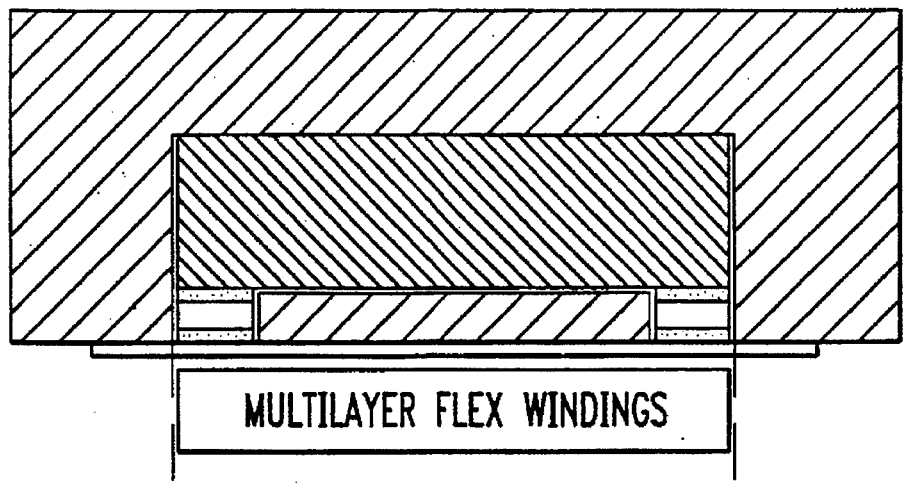
FIGS. 15 and 16 are schematics of a fixture useful in constructing the transformer and rectifier structure of the invention.
Figure 16:
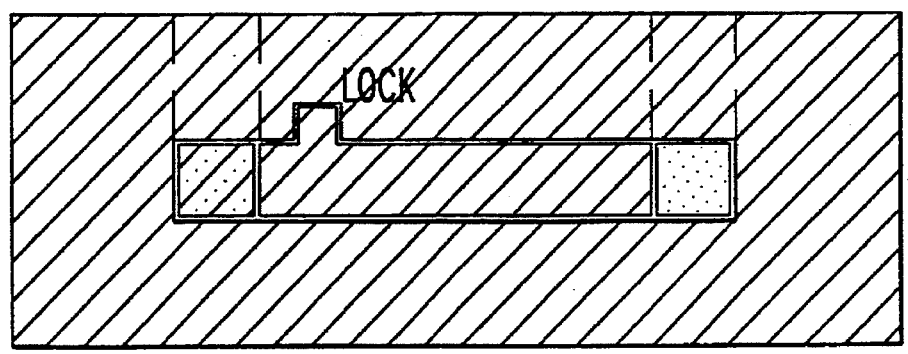

A fixture with a locking mechanism is necessary to construct the entire assembly of the copper heatsink, bare die, lead frame and windings. Plan and elevation cross sectional views of the fixture are shown in FIGS. 15 and 16. The grooves in the fixture duplicate those in the mold so that the finished molded part has an exposed heatsink, which is coplanar with all the leads. Since the bare die connects to particular points on the lead frame, it is necessary to hold them in place during the solder reflow operation. This is accomplished by using a spacer-and-lock mechanism shown in the fixture in FIG. 16.

The spacer-and-lock mechanism is placed before reflow and removed afterwards. The lock is made of steel to prevent solder attachment and allow ease of removal of the spacer-and-lock mechanism.

We claim:

1. An integral transformer/rectifier device, comprising:
    a lead frame for attachment to conductors of a circuit substrate;
    a transformer winding mounted on the lead frame;
    a diode die mounted on the lead frame and directly connected to the transformer winding; and
    an encapsulant enclosing the transformer winding and diode die.

2. An integral transformer/rectifier device as claimed in claim 1:
    wherein the transformer winding comprises a primary and a secondary winding.

3. An integral transformer/rectifier device as claimed in claim 2:
    wherein the transformer winding comprises a flex substrate.

4. An integral transformer/rectifier device as claimed in claim 3:
    wherein the encapsulant is a thermoset plastic compound.

5. An integral transformer/rectifier device as claimed in claim 4:
    wherein the device is surface mountable.

6. An integral transformer rectifier device, comprising:
    a lead frame including conductor elements for attachment to conductors of a circuit substrate;

a transformer winding mounted on the lead frame;

a diode die mounted on the lead frame and connected by lead frame conductors to the transformer winding;

an encapsulant enclosing the transformer winding and leaving a single surface of the diode die exposed;

an element mounted on the exposed single surface of the diode die and connected to provide heat transfer and an electrical connection to the diode die.

7. An integral transformer rectifier device, as claimed in claim 6, wherein the transformer winding comprises a primary and a secondary winding.

8. An integral transformer rectifier device, as claimed in claim 7:

wherein the transformer winding comprises a laminated flex substrate.

9. An integral transformer rectifier device, as claimed in claim 8:

wherein the encapsulant is a thermoset plastic compound.

10. An integral transformer rectifier device, as claimed in claim 9, wherein the device is surface mountable.

11. A method of constructing an integral transformer/ rectifier device, comprising the steps of:

constructing a lead frame having conducting leads for attachment to conductors of a circuit substrate;

mounting a transformer winding on the lead frame;

mounting a diode die on the lead frame, the transformer winding and the diode die being electrically coupled;

encapsulating the transformer winding and the diode die with an encapsulant leaving an exposed diode die surface; and mounting a heat dissipating metallic member on the exposed surface of the diode die for enabling heat transfer to the ambient environment.

12. A method of constructing an integral transformer/ rectifier device, as claimed in claim 11; comprising the further steps of:

mounting a second diode die on the lead frame and mounting a second heat dissipating metallic member on the second die.

13. A method of constructing an integral transformer/ rectifier device, as claimed in claim 11; comprising the further steps of:

mounting the device on a circuit substrate.

14. A method of constructing an integral transformer/ rectifier device, as claimed in claim 11; comprising the further steps of:

heating and attaching the diode die to the lead frame prior to the encapsulation step.

15. A method of constructing an integral transformer/ rectifier device, as claimed in claim 14; comprising the further steps of:

creating a cavity in the encapsulant.

* * * * *